United States Patent
Inoue et al.

(10) Patent No.: US 12,378,438 B2
(45) Date of Patent: Aug. 5, 2025

(54) POLISHING SOLUTION, DISPERSION, POLISHING SOLUTION PRODUCTION METHOD, AND POLISHING METHOD

(71) Applicant: Showa Denko Materials Co., Ltd., Tokyo (JP)

(72) Inventors: Keisuke Inoue, Tokyo (JP); Hiroshi Ono, Tokyo (JP)

(73) Assignee: Resonac Corporation, Tokyo (JP)

( * ) Notice: Subject to any disclaimer, the term of this patent is extended or adjusted under 35 U.S.C. 154(b) by 740 days.

(21) Appl. No.: 17/439,230

(22) PCT Filed: Jun. 2, 2020

(86) PCT No.: PCT/JP2020/021800
§ 371 (c)(1),
(2) Date: Sep. 14, 2021

(87) PCT Pub. No.: WO2020/246471
PCT Pub. Date: Dec. 10, 2020

(65) Prior Publication Data
US 2022/0145132 A1  May 12, 2022

(30) Foreign Application Priority Data
Jun. 4, 2019 (WO) .................. PCT/JP2019/022144

(51) Int. Cl.
*C09G 1/02* (2006.01)
*H01L 21/304* (2006.01)
*B82Y 40/00* (2011.01)

(52) U.S. Cl.
CPC .............. *C09G 1/02* (2013.01); *H01L 21/304* (2013.01); *B82Y 40/00* (2013.01)

(58) Field of Classification Search
CPC ..... C09G 1/02; H01L 21/304; H01L 21/3212; H01L 21/31053; H01L 21/30625; B82Y 40/00; B82Y 30/00; C09K 3/14; C09K 3/1463; B24B 37/00; B24B 57/02
See application file for complete search history.

(56) References Cited

U.S. PATENT DOCUMENTS

| 2001/0017007 A1* | 8/2001 | Hagihara | C09G 1/02 |
| | | | 106/3 |
| 2002/0028636 A1 | 3/2002 | Koichi et al. | |
| 2004/0127147 A1* | 7/2004 | Suenaga | C09K 3/1409 |
| | | | 451/36 |
| 2004/0162006 A1 | 8/2004 | Hua et al. | |
| 2009/0221213 A1* | 9/2009 | Namie | C09G 1/02 |
| | | | 451/36 |
| 2019/0031919 A1 | 1/2019 | Takeda et al. | |
| 2019/0119525 A1 | 4/2019 | Sines et al. | |
| 2019/0127607 A1* | 5/2019 | Rose | C09K 3/1445 |

FOREIGN PATENT DOCUMENTS

| CN | 1242729 A | 1/2000 | |
| CN | 1323864 A | 11/2001 | |
| CN | 102533123 A | 7/2012 | |
| JP | 2001-323254 A | 11/2001 | |
| JP | 3822339 B2 | 9/2006 | |
| JP | 2014-018923 A | 2/2014 | |
| JP | 2017-190450 A | 10/2017 | |
| KR | 10-1999-0014245 A | 2/1999 | |
| KR | 10-2009-0023640 A | 3/2009 | |
| KR | 10-2016-0132910 A | 11/2016 | |
| KR | 10-2016-0132923 A | 11/2016 | |
| KR | 10-2016-0138149 A | 12/2016 | |
| TW | 201213522 A1 | 4/2012 | |
| TW | 201612285 A | 4/2016 | |
| WO | WO-2012036087 A1 * | 3/2012 | ............... C09G 1/02 |

OTHER PUBLICATIONS

Supplemental Machine Translation from SEARCH and/or Clarivate of WO 2012036087 (Year: 2024).*

* cited by examiner

*Primary Examiner* — Alexandra M Moore
(74) *Attorney, Agent, or Firm* — Fitch, Even, Tabin & Flannery LLP

(57) ABSTRACT

A polishing liquid for CMP, containing: abrasive grains containing silica; and a liquid medium, in which a content of the abrasive grains is 1.0% by mass or more based on the total amount of the polishing liquid, and in a particle size distribution on mass basis obtained by a centrifugation method, D50 of the abrasive grains is 150 nm or less, D90 of the abrasive grains is 100 nm or more, and a difference between the D90 and the D50 is 21 nm or more.

14 Claims, 1 Drawing Sheet

(a)
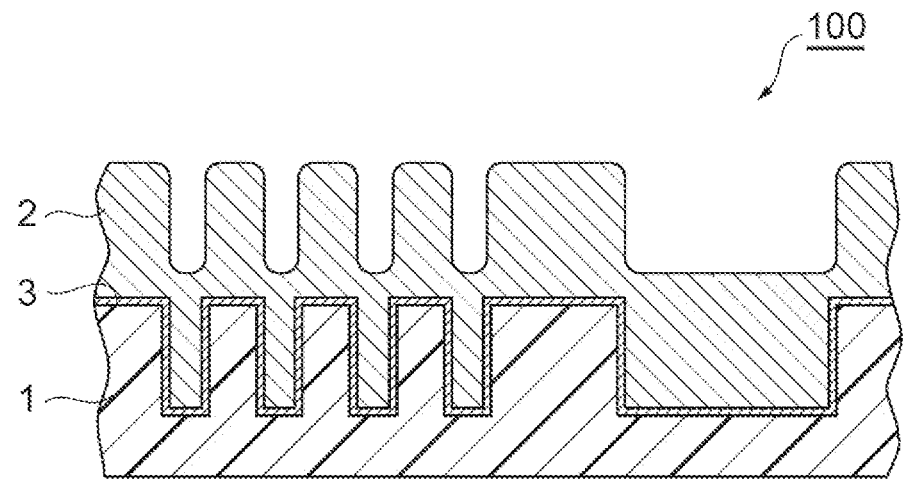
(b)
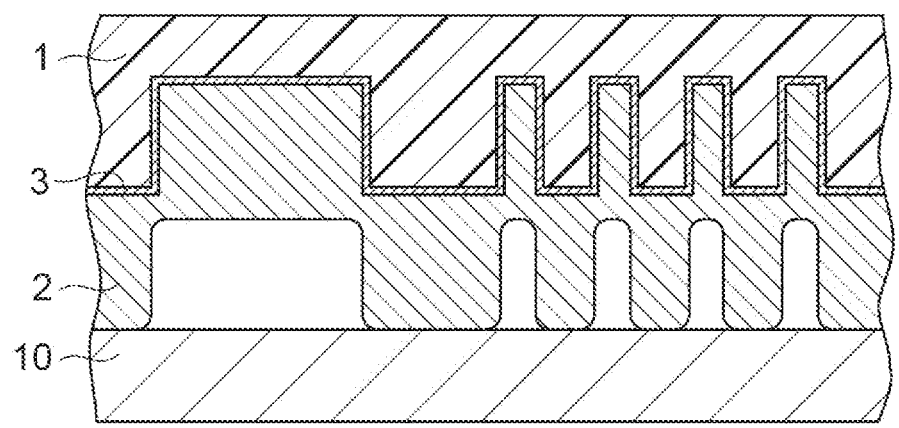
(c)
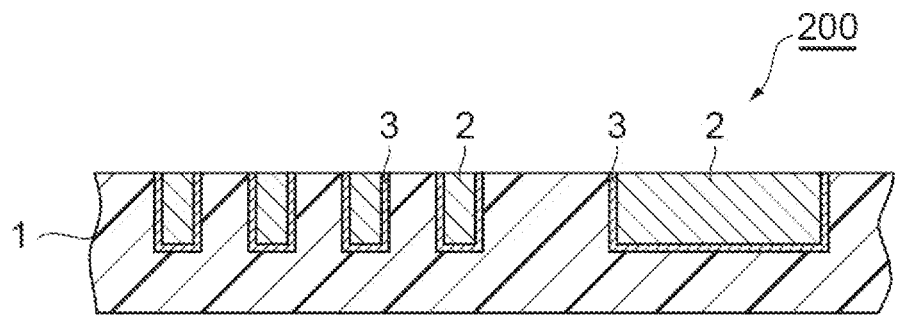

POLISHING SOLUTION, DISPERSION, POLISHING SOLUTION PRODUCTION METHOD, AND POLISHING METHOD

CROSS-REFERENCE TO RELATED APPLICATIONS

This application is a U.S. national phase application filed under 35 U.S.C. § 371 of International Application No. PCT/JP2020/021800, filed Jun. 2, 2020, designating the United States, which claims priority from International Application No. PCT/JP2019/022144, filed Jun. 4, 2019, which are hereby incorporated herein by reference in their entirety.

TECHNICAL FIELD

The present invention relates to a polishing liquid, a dispersion, a method for producing a polishing liquid, and a polishing method.

BACKGROUND ART

In recent years, new microfabrication technologies have been developed along with the tendencies of higher integration and higher performance of semiconductor integrated circuits (hereinafter, referred to as "LSI"). A chemical mechanical polishing (hereinafter, referred to as "CMP") method is one of such technologies, and is a technique that is frequently used in the LSI manufacturing process, particularly, flattening of an insulating film, formation of metal plug, formation of buried wiring in multilayer interconnection forming process, or the like.

As an example, formation of buried wiring using a CMP method will be described. First, a laminate, which a base substrate (for example, a substrate) having irregularities formed in advance on a surface thereof and a film containing an insulating material (hereinafter, also referred to as "insulating film") stacked on the base substrate, is prepared. Next, a film containing a barrier material (hereinafter, also referred to as "barrier film") is deposited on the entire insulating film. Further, a metal film for wiring is deposited on the entire barrier film so as to bury a concave portion (groove portion). Next, the unnecessary metal film for wiring other than the concave portion and the barrier film on the lower layer thereof are removed by CMP, thereby forming buried wiring. Such a wiring formation method is called a damascene method (see, for example, Patent Literature 1 below).

In recent years, a tungsten material such as tungsten or a tungsten alloy has been used in a wiring metal film. As a wiring formation method using a film containing a tungsten material (hereinafter, also referred to as "tungsten film") by a damascene method, for example, a method including a first polishing step of polishing a large part of a tungsten film and a second polishing step of polishing the tungsten film and a barrier film is generally used, and depending on circumstances, a third step of polishing the tungsten film, the barrier film, and an insulating film (finish polishing step) is executed. Patent Literature 1 discloses a polishing liquid for CMP that may be used in the above-described method (particularly, the first polishing step).

CITATION LIST

Patent Literature

Patent Literature 1: Japanese Patent No. 3822339

SUMMARY OF INVENTION

Technical Problem

In the first polishing step, not only the tungsten film but also the barrier film and the insulating film may be polished in some cases. It is required that a polishing liquid for CMP to be used in the first polishing step is not only excellent in a polishing rate of a tungsten material in order to improve throughput but also excellent in a ratio of the polishing rate of a tungsten material to a polishing rate of an insulating material (the polishing rate of the tungsten material/the polishing rate of the insulating material; hereinafter, also simply referred to as "polishing rate ratio") in order to obtain excellent flatness in the subsequent second polishing step or suppress an excessive decrease in insulation properties between wirings caused when an insulating film is polished to be too thin.

On the other hand, in the method of Patent Literature 1, it is difficult to achieve both the polishing rate of the tungsten material and the above-described polishing rate ratio to a high degree.

In this regard, an object of the present invention is to provide a polishing liquid for CMP capable of polishing a tungsten material at an excellent polishing rate and with high selectivity with respect to an insulating material, a dispersion for this polishing liquid, a method for producing this polishing liquid, and a polishing method using this polishing liquid.

Solution to Problem

An aspect of the present invention relates to a polishing liquid for CMP, containing: abrasive grains containing silica; and a liquid medium, in which in a particle size distribution on mass basis obtained by a centrifugation method, D50 of the abrasive grains is 150 nm or less, D90 of the abrasive grains is 100 nm or more, and a difference between the D90 and the D50 is 21 nm or more, and a content of the abrasive grains is 1.0% by mass or more based on the total amount of the polishing liquid. According to this polishing liquid, a tungsten material can be polished at an excellent polishing rate and with high selectivity with respect to an insulating material. That is, according to the polishing liquid of the above-described aspect, both of the polishing rate of the tungsten material and the polishing rate ratio (the polishing rate of the tungsten material/the polishing rate of the insulating material) can be achieved to a high degree.

A content of the abrasive grains may be 5.0% by mass or less based on the total amount of the polishing liquid.

D50 of the abrasive grains may be 50 nm or more.

D90 of the abrasive grains may be 200 nm or less.

The polishing liquid may further contain an oxidizing agent. This oxidizing agent may contain hydrogen peroxide.

The polishing liquid may further contain an iron ion supplying agent. This iron ion supplying agent may contain at least one selected from the group consisting of iron nitrate and iron nitrate hydrate.

The polishing liquid may further contain an organic acid. In a case where the polishing liquid further contains an organic acid, a ratio of a molecular number of the dissociated organic acid with respect to one iron ion atom may be 2.0 or more.

The organic acid may be a divalent or trivalent organic acid having no carbon-carbon unsaturated bond, and may contain at least one selected from the group consisting of malonic acid, succinic acid, adipic acid, glutaric acid, malic acid, and citric acid.

The polishing liquid may further contain an anticorrosive agent. This anticorrosive agent may contain an azole compound having no thiol group and/or carbon-carbon unsaturated bond, and may contain a compound represented by Formula (1) below and having no thiol group and/or carbon-carbon unsaturated bond.

$$H_2N-X-COOH \qquad (1)$$

[In Formula (1), X represents a hydrocarbon group optionally having a substituent and having 1 or more carbon atoms.]

The anticorrosive agent preferably contains at least one selected from the group consisting of 1,2,4-triazole, 4-amino-1,2,4-triazole, glycine, and 6-aminohexanoic acid.

A pH of the polishing liquid may be 4.0 or less or may be 2.0 or more.

The polishing liquid may be a polishing liquid that is used for polishing at least a second portion of a base substrate including a first portion composed of an insulating material and the second portion provided on the first portion and composed of a tungsten material.

Another aspect of the present invention relates to a dispersion being used in a polishing liquid for CMP, the dispersion containing: abrasive grains containing silica; and a liquid medium, in which in a particle size distribution on mass basis obtained by a centrifugation method, D50 of the abrasive grains is 150 nm or less, D90 of the abrasive grains is 100 nm or more, and a difference between the D90 and the D50 is 21 nm or more. According to this dispersion, it is possible to obtain a polishing liquid for CMP capable of achieving both of a polishing rate of a tungsten material and a polishing rate ratio (a polishing rate of a tungsten material/a polishing rate of an insulating material) to a high degree.

Still another aspect of the present invention relates to a method for producing a polishing liquid for CMP, the method including a step of mixing abrasive grains containing silica and a liquid medium, in which in a particle size distribution on mass basis obtained by a centrifugation method, D50 of the abrasive grains is 150 nm or less, D90 of the abrasive grains is 100 nm or more, and a difference between the D90 and the D50 is 21 nm or more, and in the step, the abrasive grains are mixed so that a content of the abrasive grains becomes 1.0% by mass or more based on the total amount of the polishing liquid. According to this polishing liquid obtained by this method, a tungsten material can be polished at an excellent polishing rate and with high selectivity with respect to an insulating material.

Still another aspect of the present invention relates to a method for polishing a base substrate, the method including: a step of preparing a base substrate including a first portion composed of an insulating material and a second portion provided on the first portion and composed of a tungsten material; a step of disposing the base substrate on a polishing pad so that a surface of the second portion on a side opposite to the first portion faces the polishing pad; and a step of polishing at least the second portion by supplying the above-described polishing liquid between the polishing pad and the base substrate and relatively moving the polishing pad and the base substrate. According to this method, a tungsten material can be polished at an excellent polishing rate and with high selectivity with respect to an insulating material.

Advantageous Effects of Invention

According to the present invention, it is possible to provide a polishing liquid for CMP capable of polishing a tungsten material at an excellent polishing rate and with high selectivity with respect to an insulating material, a dispersion for this polishing liquid, a method for producing this polishing liquid, and a polishing method using this polishing liquid.

BRIEF DESCRIPTION OF DRAWINGS

FIG. 1 is a schematic cross-sectional view illustrating a polishing method of an embodiment.

DESCRIPTION OF EMBODIMENTS

In the present specification, "polishing rate of a material A" and "polishing rate with respect to a material A" mean a removal rate for a substance composed of the material A by polishing. In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage may be replaced with the upper limit value or the lower limit value of the numerical range of another stage. Materials listed as examples in the present specification can be used singly or in combinations of two or more, unless otherwise specifically indicated. In the present specification, "pH" is defined as pH when the temperature of an object to be measured is 25° C.

Hereinafter, preferred embodiments of the present invention will be described. However, the present invention is not limited to the following embodiments at all.

<Polishing Liquid for CMP>

The polishing liquid of the present embodiment is a polishing liquid (polishing liquid for CMP) that is used in a chemical mechanical polishing (CMP) method, and contains abrasive grains containing silica and a liquid medium. In this polishing liquid for CMP, the content of the abrasive grains containing silica is 1.0% by mass or more based on the total amount of the polishing liquid. Furthermore, in a particle size distribution on mass basis obtained by a centrifugation method, D50 of the abrasive grains is 150 nm or less, D90 of the abrasive grains is 100 nm or more, and a difference between the D90 and the D50 is 21 nm or more.

The D50 is a particle diameter at which a cumulative relative weight of the particle from a smaller particle diameter side reaches 50% of the total particle weight, and the D90 is a particle diameter at which a cumulative relative weight of the particle from a smaller particle diameter side reaches 90% of the total particle weight. The D50 and D90 are obtained from particle size distribution that is obtained by being measured at 25° C. using an apparatus (product name: DC24000) manufactured by Nihon Rufuto Co., Ltd. that is a centrifugal particle size distribution analyzer. For measurement of the D50 and the D90, the abrasive grains containing silica themselves before being mixed in the polishing liquid may be measured, or the abrasive grains containing silica in the polishing liquid may be measured. In the case of using the abrasive grains containing silica themselves, the abrasive grains containing silica may be diluted with water to the same degree as the concentration of the abrasive grains in the polishing liquid.

According to the above-described polishing liquid of the present embodiment, the effect that a tungsten material can be polished at an excellent polishing rate and with high selectivity with respect to an insulating material. It is a very surprising result to obtain the above-described effect by setting the particle diameter of the abrasive grains containing silica in the above specific range. The reason for this is that it is generally necessary to increase the average particle diameter of the abrasive grains to some extent in order to obtain a high polishing rate with respect to a tungsten material, but in this case, a polishing rate with respect to an insulating material tends to also increase. On the other hand, when the average particle diameter of the abrasive grains is decreased in order to lower a polishing rate with respect to an insulating material, a polishing rate with respect to a tungsten material is also lowered. As described above, a high polishing rate with respect to a tungsten material and a low polishing rate with respect to an insulating material are phenomena contradictory to each other, and it is considered that achieving of both of them is difficult by adjusting the particle diameter of the abrasive grains. However, the present inventors have conducted intensive studies, and as a result, have found that, in a case where the amount of the abrasive grains containing silica is set to 1.0% by mass or more, when the D50 is set to 150 nm or less, the D90 is set to 100 nm or more, and the difference (D90–D50) between the D90 and the D50 is set to 21 nm or more, a tungsten material can be polished at an excellent polishing rate, and the polishing rate of an insulating material is suppressed so as to obtain a high polishing rate ratio.

Meanwhile, for the polishing liquid for CMP, from the viewpoint of cost reduction, production stability, or the like, it is desired that performance such as a polishing rate is stable (pot life is long) over a long period of time (for example, about 1 week). In a conventional polishing liquid, in order to increase a polishing rate ratio, an adjusting agent such as polyethylenimine or polyacrylamide is used in some cases, but such an adjusting agent may cause the abrasive grains to be aggregated and the storage stability of the polishing liquid to be degraded. On the other hand, according to the polishing liquid of the present embodiment, since an excellent polishing rate ratio is obtained, an adjusting agent as described above is not necessarily used, and a longer pot life is easily obtained.

The pH of the polishing liquid for CMP is preferably 4.0 or less, more preferably 3.8 or less, and further preferably 3.6 or less, from the viewpoint that the etching rate of the tungsten material is not excessively increased and the viewpoint that the above-described effect of the present invention is more significantly exhibited. The pH of the polishing liquid for CMP may be 3.4 or less, 3.2 or less, 3.0 or less, or 2.8 or less. When the etching rate of the tungsten material is excessively increased, the surface after polishing is hardly flattened, and thus it is difficult to achieve both of a high polishing rate and flatness. The pH of the polishing liquid for CMP is preferably 2.0 or more, more preferably 2.2 or more, and further preferably 2.5 or more, from the viewpoint of suppressing the occurrence of corrosion with respect to a polishing apparatus or the like and suppressing an etching rate with respect to a tungsten material. From these viewpoints, the pH of the polishing liquid for CMP may be 2.0 to 4.0, 2.2 to 3.8, or 2.5 to 3.6. The pH of the polishing liquid for CMP can be measured by the method described in Examples.

The polishing liquid for CMP of the present embodiment may further contain components other than the abrasive grains containing silica and the liquid medium. Examples of the other components include an oxidizing agent, an iron ion supplying agent, an organic acid, an anticorrosive agent, and a pH adjusting agent. Hereinafter, the respective components contained in the polishing liquid for CMP will be specifically described.

(Abrasive Grains)

Examples of the abrasive grains containing silica include amorphous silica, crystalline silica, molten silica, spherical silica, synthetic silica, hollow silica, and colloidal silica. Among these, colloidal silica is preferred from the viewpoint that defects such as scratches are less likely to occur on the surface after polishing of the object to be polished and the flatness of the polished surface can be improved.

The content of silica in the abrasive grains containing silica may be 80% by mass or more, 90% by mass or more, 95% by mass or more, 98% by mass or more, or 99% by mass or more, from the viewpoint of easily obtaining a polishing rate necessary for polishing. The abrasive grains containing silica may contain components other than silica, and may be substantially composed of silica. In a case where the abrasive grains containing silica contain components other than silica, it is preferable that the outermost surface of the abrasive grains containing silica is configured by silica (for example, the surface of the abrasive grains is not covered with other components such as ceria). Note that, in a case where the polishing liquid contains abrasive grains other than the abrasive grains containing silica, the content of silica may be in the above range based on the whole abrasive grains (the whole abrasive grains contained in the polishing liquid).

The D50 of the abrasive grains containing silica is preferably 115 nm or less, more preferably 105 nm or less, and further preferably 100 nm or less, from the viewpoint of obtaining a more excellent polishing rate with respect to a tungsten material. The D50 may be 95 nm or less, 90 nm or less, 85 nm or less, or 80 nm or less. The D50 is preferably 50 nm or more, more preferably 60 nm or more, and further preferably 70 nm or more, from the viewpoint of obtaining a more excellent polishing rate with respect to a tungsten material. The D50 may be 75 nm or more, 80 nm or more, 85 nm or more, or 90 nm or more. From these viewpoints, the D50 may be, for example, 50 to 150 nm, 60 to 115 nm, or 70 to 100 nm.

The D90 of the abrasive grains containing silica is preferably 105 nm or more from the viewpoint that the polishing rate with respect to an insulating material can be further suppressed and a higher polishing rate ratio is obtained. The D90 may be 110 nm or more, 115 nm or more, or 120 nm or more. The D90 is preferably 200 nm or less, more preferably 180 nm or less, and further preferably 160 nm or less, from the viewpoint of obtaining a more excellent polishing rate with respect to a tungsten material, and the viewpoint that defects such as scratches are less likely to occur on the surface after polishing of the object to be polished and the flatness of the polished surface can be improved. The D90 may be 140 nm or less or 125 nm or less. From these viewpoints, the D90 may be, for example, 100 to 200 nm, 105 to 180 nm, or 110 to 160 nm.

The difference (D90–D50) between the above-described D90 and the above-described D50 is preferably 22 nm or more from the viewpoint of obtaining a higher polishing rate ratio. The difference (D90–D50) may be 25 nm or more, 30 nm or more, 35 nm or more, 40 nm or more, 45 nm or more, or 50 nm or more. The difference (D90–D50) is preferably 90 nm or less, more preferably 60 nm or less, and further preferably 55 nm or less, from the viewpoint of obtaining a higher polishing rate ratio. The difference (D90–D50) may be 50 nm or less, 45 nm or less, or 40 nm or less. From these viewpoints, the difference (D90−D50) may be, for example, 22 to 90 nm, 30 to 60 nm, or 35 to 55 nm.

The content of the abrasive grains containing silica is preferably 1.2% by mass or more, more preferably 1.5% by mass or more, further preferably 1.9% by mass or more, and particularly preferably 2.3% by mass or more, based on the total mass of the polishing liquid, from the viewpoint of obtaining a more excellent polishing rate with respect to a tungsten material. When the content of the abrasive grains containing silica is more than 5.0% by mass, since the effect of improving the polishing rate with respect to a tungsten material is less likely to be obtained, the content of the abrasive grains containing silica may be 5.0% by mass or less based on the total mass of the polishing liquid. Furthermore, the content of the abrasive grains containing silica is more preferably 4.0% by mass or less and further preferably 3.0% by mass or less, based on the total mass of the polishing liquid, from the viewpoint that defects such as scratches are less likely to occur on the surface after polishing of the object to be polished. From these viewpoints, the content of the abrasive grains containing silica may be, for example, 1.0 to 5.0% by mass, 1.2 to 4.0% by mass, 1.5 to 3.0% by mass, 1.9 to 3.0% by mass, or 2.3 to 3.0% by mass, based on the total mass of the polishing liquid.

The polishing liquid may contain abrasive grains other than the abrasive grains containing silica as long as the effect of the present invention is not inhibited.

(Liquid Medium)

The liquid medium is not particularly limited; however, water such as deionized water or ultrapure water is preferred. The content of the liquid medium may correspond to the remaining of the polishing liquid from which the contents of other constituent components are removed, and is not particularly limited.

(Oxidizing Agent)

An oxidizing agent contributes to improvement in the polishing rate of a tungsten material. That is, in a case where the polishing liquid contains an oxidizing agent, the polishing rate of a tungsten material tends to be improved.

Examples of the oxidizing agent include hydrogen peroxide ($H_2O_2$), potassium periodate, ammonium persulfate, hypochlorous acid, and ozone water. These may be used singly or in combination of two or more kinds thereof. As the oxidizing agent, hydrogen peroxide is preferably used, from the viewpoint that it is relatively stable even after addition and has no concern of contamination due to a halide or the like.

The content of the oxidizing agent is preferably 0.1% by mass or more, more preferably 1.0% by mass or more, and further preferably 2% by mass or more, based on the total mass of the polishing liquid, from the viewpoint of easily obtaining the effect of improving the polishing rate. The content of the oxidizing agent is preferably 10.0% by mass or less, more preferably 7.0% by mass or less, and further preferably 5.0% by mass or less, based on the total mass of the polishing liquid, from the viewpoint of easily suppressing the etching rate of the tungsten material.

(Iron Ion Supplying Agent)

The iron ion supplying agent supplies iron ions to the polishing liquid for CMP. The iron ions are preferably ferric ions. The iron ion supplying agent is, for example, a salt of iron, and may exist in a state of being dissociated into iron ions and an iron ion supplying agent-derived anionic component in the polishing liquid. That is, the polishing liquid containing an iron ion supplying agent contains iron ions. In a case where the polishing liquid for CMP contains an iron ion supplying agent, that is, the polishing liquid for CMP contains iron ions, there is a tendency that a polishing rate of a tungsten material is further improved. Note that, though the iron ion supplying agent functions as an oxidizing agent in some cases, in the present specification, a compound corresponding to both of an iron ion supplying agent and an oxidizing agent is regarded as an iron ion supplying agent.

The iron ion supplying agent may be an inorganic salt or an organic salt. Examples of the inorganic salt containing an iron ion include iron nitrate, iron sulfate, iron boride, iron chloride, iron bromide, iron iodide, iron phosphate, and iron fluoride. Examples of the organic salt containing an iron ion include iron triformate, iron diformate, iron acetate, iron propionate, iron oxalate, iron malonate, iron succinate, iron malate, iron glutarate, iron tartrate, iron lactate, and iron citrate. These inorganic salt and organic salt may include a ligand such as ammonium or water, and may be a hydrate or the like. The iron ion supplying agent may be used singly or in combination of two or more kinds thereof. Among the above-described examples, from the viewpoint of relatively low contamination to a polishing apparatus and a base substrate, and a low cost and easy accessibility, iron nitrate and iron nitrates (a hydrate or the like) are preferred.

The content of the iron ion supplying agent may be adjusted so that the content of the iron ion in the polishing liquid is in the following range. The content of the iron ion is preferably 0.0003% by mass or more, more preferably 0.0005% by mass or more, and further preferably 0.001% by mass or more, based on the total mass of the polishing liquid, from the viewpoint of further improving a polishing rate of a tungsten material. The content of the iron ion is preferably 0.1% by mass or less, more preferably 0.05% by mass or less, and further preferably 0.01% by mass or less, based on the total mass of the polishing liquid, from the viewpoint that the decomposition and change of properties of the oxidizing agent or the like are less likely to occur and a change in polishing rate with respect to a tungsten material after storage of the polishing liquid for CMP at room temperature (for example, 25° C.) is easily suppressed (that is, pot life is excellent). From these viewpoints, the content of the iron ion may be, for example, 0.0003 to 0.1% by mass, 0.0005 to 0.05% by mass, or 0.001 to 0.01% by mass, based on the total mass of the polishing liquid.

(Organic Acid)

In a case where the polishing liquid contains an organic acid, there are tendencies that the oxidizing agent contained in the polishing liquid is likely to be maintained in a stable state and the effect of improving the polishing rate with respect to a tungsten material is stably exhibited. Particularly, in a polishing liquid containing an iron ion and an oxidizing agent, the oxidizing agent is decomposed by the iron ion and properties of other additives (for example, an anticorrosive agent) are changed at the time of decomposition of the oxidizing agent, so that a pot life of the polishing liquid tends to decrease; however, in a case where the polishing liquid contains an organic acid, the decomposition of the above-described oxidizing agent can be suppressed. Therefore, in the present embodiment, an organic acid is preferably used in a polishing liquid containing an oxidizing agent, and an organic acid is more preferably used in a polishing liquid containing an iron ion and an oxidizing agent. Note that, the organic acid may be contained as a pH adjusting agent in the polishing liquid.

The reason why the above-described effect is obtained by the organic acid is not clear, but it is speculated that the organic acid is dissociated in the polishing liquid and the dissociated organic acid chelates the iron ion so that the decomposition of the oxidizing agent by the iron ion can be suppressed. Herein, the term "dissociation" means that a proton (H+) is dissociated from at least one acid group (for example, a carboxy group (—COOH)) which the organic acid has in the polishing liquid and the acid group exists in a state of an anionic group (for example, —COO⁻).

The acid group of the organic acid is preferably a carboxy group from the viewpoint that the above-described effect is likely to be exhibited.

The organic acid preferably has no carbon-carbon unsaturated bond from the viewpoint that the oxidizing agent is likely to be maintained more stably and the polishing rate of a tungsten material can be further stabilized. The reason why the stability of the oxidizing agent is improved when the organic acid has no carbon-carbon unsaturated bond is not clear, but a cause for this is considered that, since the reactivity of the carbon-carbon unsaturated bond part is relatively high, the change of properties due to reaction with the oxidizing agent in the polishing liquid does not occur when the organic acid is not carbon-carbon unsaturated bonded.

The organic acid is preferably a divalent or trivalent organic acid. Herein, the term "divalent or trivalent" means the number of acid groups which the organic acid has. When the organic acid is divalent or trivalent, iron ions are chelated by a plurality of acid groups (for example, two or more dissociated acid groups) which the organic acid has, and thus there is a tendency that the oxidizing agent is likely to be maintained more stably.

As the organic acid, an organic acid having a dissociation rate at pH 2.5 of 1% or more is preferably used. Such an organic acid is particularly suitable in a case where the pH of the polishing liquid is 2.0 to 4.0. The dissociated organic acid is effective in chelating of the iron ion, and thus when the dissociation rate is 1% or more, the necessary amount of the organic acid can be reduced. From this viewpoint, the dissociation rate of the organic acid at pH 2.5 is more preferably 3% or more and further preferably 10% or more.

From the above-described viewpoint, the organic acid is preferably a divalent or trivalent organic acid having no carbon-carbon unsaturated bond, and further preferably a divalent or trivalent organic acid having a dissociation rate at pH 2.5 of 1% or more and having no carbon-carbon unsaturated bond.

Specific preferred examples of the organic acid include malonic acid (dissociation rate at pH 2.5: 41.4%), succinic acid (dissociation rate at pH 2.5: 3.1%), glutaric acid (dissociation rate at pH 2.5: 1.4%), adipic acid (dissociation rate at pH 2.5: 1.7%), malic acid (dissociation rate at pH 2.5: 15.4%), and citric acid (dissociation rate at pH 2.5: 19.0%). These organic acids may be used singly or in combination of two or more kinds thereof.

The ratio of the molecular number of the dissociated organic acid with respect to one iron ion atom is preferably 2.0 or more, more preferably 4 or more, and further preferably 6 or more, from the viewpoint of sufficiently chelating the iron ion and enhancing the stability of the oxidizing agent. The molecular number of the dissociated organic acid can be calculated from the dissociation rate of the organic acid. The dissociation rate of the organic acid can be calculated based on the pH of the polishing liquid and the acid dissociation constant of the organic acid.

The content of the organic acid is preferably adjusted so that the ratio of the molecular number of the dissociated organic acid with respect to one iron ion atom is in the aforementioned range, from the viewpoint that the iron ion of the organic acid is sufficiently chelated and the stability of the oxidizing agent is enhanced. For example, in a case where malonic acid is used as the organic acid, the content of the iron ion is set to 0.001% by mass, and the pH of the polishing liquid is set to 2.5, since the dissociation rate at pH 2.5 of the malonic acid is 41.4%, the mixing amount of the malonic acid is preferably 0.009% by mass (the dissociated malonic acid with respect to one iron ion atom is two molecules) or more. Note that, regarding the above-described mixing amount, the molar quantity of iron ions was calculated from the atomic weight and mixing amount of iron ions when the molecular weight of malonic acid was 104.06 and the atomic weight of iron ions was 55.85, and the above-described mixing amount was obtained by being calculated from the molecular weight thereof, the dissociation rate and molecular weight of malonic acid, and the mixing ratio of malonic acid with respect to one iron ion atom.

(Anticorrosive Agent)

The polishing liquid may contain an anticorrosive agent from the viewpoint of suppressing the etching rate of the tungsten material. As the anticorrosive agent, a general azole-based anticorrosive agent, a compound represented by Formula (1) below, and the like can be used. However, from the viewpoint of preventing a pot life from being decreased, an azole compound or a compound represented by Formula (1) below that has no thiol group or carbon-carbon unsaturated bond is preferred, and an azole compound or a compound represented by Formula (1) below that has no thiol group and carbon-carbon unsaturated bond is more preferred. In the case of using an azole compound or a compound represented by Formula (1) below that has a thiol group and/or a carbon-carbon unsaturated bond, the etching rate tends to increase, and further, the pot life also tends to be decreased. The reasons for this are not clear, but one of the reasons is considered that the oxidizing agent in the polishing liquid reacts with a thiol group and/or a carbon-carbon unsaturated bond site so as to change properties of the oxidizing agent and the anticorrosive agent. Therefore, in the present embodiment, in a case where the polishing liquid contains an oxidizing agent that reacts with a thiol group and/or a carbon-carbon unsaturated bond site, the polishing liquid preferably contains at least one selected from the group consisting of an azole compound having no thiol group or carbon-carbon unsaturated bond, a compound represented by Formula (1) below and having no thiol group or carbon-carbon unsaturated bond, an azole compound having no thiol group and carbon-carbon unsaturated bond, and a compound represented by Formula (1) below and having no thiol group and carbon-carbon unsaturated bond.

$$H_2N—X—COOH \quad (1)$$

[In formula, X represents a hydrocarbon group optionally having a substituent and having 1 or more carbon atoms.]

In Formula (1), the hydrocarbon group may be linear or branched. The hydrocarbon group may be either saturated or unsaturated, but is preferably saturated (has no carbon-carbon unsaturated bond). The number of carbon atoms of the hydrocarbon group may be, for example, 1 to 16. The substituent may be, for example, a group or the like including a halogen atom or a heteroatom, but is preferably not a thiol group. The hydrocarbon group is preferably a linear or branched alkylene group and more preferably a linear alkylene group.

Examples of the anticorrosive agent include glycine, 6-aminohexanoic acid, 1,2,4-triazole, 1H-tetrazole, 1,2,4-triazole-3-carboxamide, 3-amino-1,2,4-triazole, 4-amino-1,2,4-triazole, 5-methyltetrazole, 5-amino-1H-tetrazole, 1H-tetrazole-1-acetic acid, 1,5-pentamethylene tetrazole, 3,5-diamino-1,2,4-triazole, 1H-1,2,3-triazole, 1,2,4-triazole carboxylic acid ethyl ester, methyl 1,2,4-triazole-3-carboxylate, and derivatives thereof. Among these, glycine, 6-aminohexanoic acid, 1,2,4-triazole, and 4-amino-1,2,4-triazole are preferred from the viewpoint of easily suppressing the etching rate of the tungsten material.

The content of the anticorrosive agent is preferably 0.003% by mass or more, more preferably 0.005% by mass or more, further preferably 0.01% by mass or more, and particularly preferably 0.02% by mass or more, based on the total mass of the polishing liquid, from the viewpoint of suppressing the etching rate of a tungsten film. The content of the anticorrosive agent is preferably 0.5% by mass or less, more preferably 0.3% by mass or less, and further preferably 0.2% by mass or less, based on the total mass of the polishing liquid, from the viewpoint of avoiding that the effect of increasing the polishing rate of the tungsten material is hardly obtained. From these viewpoints, the content thereof may be 0.003 to 0.5% by mass, 0.005 to 0.3% by mass, 0.01% by mass to 0.3% by mass, or 0.02% by mass to 0.2% by mass.

(pH Adjusting Agent)

As the pH adjusting agent, an organic acid, an inorganic acid, an organic base, and an inorganic base that are already known can be used.

As the organic acid, oxalic acid, malonic acid, tartaric acid, succinic acid, glutaric acid, adipic acid, pimelic acid, suberic acid, malic acid, citric acid, butanetetracarboxylic, and the like can be used. As the inorganic acid, sulfuric acid, nitric acid, phosphoric acid, hydrochloric acid, and the like can be used. Two or more kinds of these organic acids and inorganic acids may be used in combination.

As the organic base, methylamine, ethylamine, propylamine, monoethanolamine, tetramethylammonium hydroxide, and the like can be used. As the inorganic base, ammonia, sodium hydroxide, potassium hydroxide, and the like can be used. Two or more kinds of these organic bases and inorganic bases may be used in combination.

(Other Components)

The polishing liquid may contain components other than the aforementioned components as long as the effect of the present invention is not inhibited. For example, the polishing liquid may contain an adjusting agent including an anionic surfactant such as polyacrylic acid, a cationic surfactant such as polyethylenimine, a nonionic surfactant such as polyglycerol or polyacrylamide, or the like.

As described above, the polishing liquid of the present embodiment is preferably a polishing liquid for CMP, containing abrasive grains containing silica, an oxidizing agent, an organic acid, and water, in which D50 of the abrasive grains is 50 to 115 nm, D90 of the abrasive grains is 100 to 200 nm, a difference (D90–D50) between the D90 and the D50 is 21 nm or more, a content of the abrasive grains containing silica is 1.0 to 5.0% by mass based on the total mass of the polishing liquid, and a pH is 2.0 to 4.0, more preferably the polishing liquid for CMP in which the above-described abrasive grains containing silica are colloidal silica, and further preferably the polishing liquid for CMP further containing an iron ion supplying agent.

The polishing liquid, which has been described above, can be widely used as a polishing liquid to be used in CMP, and is particularly suitable for a polishing liquid for CMP that is used for polishing a tungsten material. Specifically, for example, the polishing liquid is used for polishing at least a second portion of a base substrate (for example, substrate) including a first portion composed of an insulating material and the second portion provided on the first portion and composed of a tungsten material. The polishing liquid may be used for polishing the first portion in addition to the second portion.

The first portion may be, for example, a part or the whole of a film containing an insulating material (insulating film) Examples of the insulating material include a silicon-based insulating material and an organic polymer-based insulating material. Examples of the silicon-based insulating material include silicon oxide (for example, silicon dioxide obtained by using tetraethyl orthosilicate (TEOS)), silicon nitride, tetraethoxysilane, fluorosilicate glass, trimethylsilane, organosilicate glass obtained by using dimethoxydimethylsilane as a starting material, silicon oxynitride, hydrogenated silsesquioxane, silicon carbide, and silicon nitride. Examples of the organic polymer-based insulating material include wholly aromatic low-dielectric constant insulating materials.

The second portion may be, for example, a part or the whole of a film containing a tungsten material (tungsten film) Examples of the tungsten material include tungsten, tungsten nitride, tungsten silicide, and a tungsten alloy. The content of tungsten in the tungsten material is preferably 80% by mass or more, more preferably 90% by mass or more, and further preferably 95% by mass or more.

The base substrate may further include a third portion composed of a barrier material between the first portion and the second portion. The polishing liquid may be used for polishing the third portion in addition to the second portion (further, the first portion). The third portion may be, for example, a part or the whole of a film containing a barrier material (barrier film) Examples of the barrier material include tantalum, tantalum nitride, titanium, and titanium nitride.

As the base substrate as described above, a base substrate that is applied to a wiring formation process by a damascene method is exemplified. In other words, the polishing liquid for CMP of the above-described embodiment is suitable for a polishing liquid for CMP that is used in a wiring formation process by a damascene method.

The polishing liquid for CMP may be stored or transported in a state of a dispersion containing the abrasive grains and the liquid medium mentioned above. The dispersion may be obtained by removing a part of the liquid medium from the aforementioned polishing liquid for CMP to be condensed, or may be obtained by diluting the aforementioned polishing liquid for CMP with the liquid medium. In other words, the polishing liquid for CMP may be stored or transported in a state where a part of the liquid medium is removed and condensed, or may be stored or transported in a state of being diluted with the liquid medium. Components (additives) other than the abrasive grains containing silica and the liquid medium may not be contained in the dispersion. For example, the polishing liquid for CMP may be stored or transported in a state of a polishing liquid set in which constituent components of the polishing liquid are divided into a first liquid (a liquid containing abrasive grains containing silica and a liquid medium) and a second liquid (a liquid containing an additive and a liquid medium). In this case, at the time of use, the first liquid and the second liquid may be mixed and used. Furthermore, the polishing liquid for CMP may be stored or transported in a state of being divided into the abrasive grains and the liquid medium. In this case, at the time of use, the abrasive grains and the liquid medium may be mixed and used.

<Method for Producing Polishing Liquid for CMP>

A method for producing a polishing liquid for CMP of the present embodiment includes, for example, a step of mixing abrasive grains containing silica and a liquid medium. In the step, the abrasive grains containing silica are mixed so that a content of the abrasive grains containing silica becomes 1.0% by mass or more based on the total amount of the polishing liquid. The D50 of the abrasive grains containing silica used in the above-described step is 150 nm or less, D90 thereof is 100 nm or more, and a difference (D90–D50) between the D90 and the D50 is 21 nm or more. The D90 and the D50 can be measured by dispersing the above-described abrasive grains in water so as to have the same concentration as the concentration of the abrasive grains in the polishing liquid to thereby prepare an aqueous dispersion liquid and applying the aforementioned method to this dispersion liquid. According to the method of the present embodiment, the aforementioned polishing liquid can be obtained.

The mixing amount of the abrasive grains containing silica may be adjusted so that the content of the abrasive grains containing silica in the polishing liquid is in the aforementioned range. Furthermore, preferred ranges of the D50 and the D90 of the abrasive grains containing silica and the difference between the D50 and the D90 are the same as the preferred ranges described in the above-described polishing liquid.

In the above-described step, components (such as an oxidizing agent, an iron ion supplying agent, an organic acid, an anticorrosive agent, and a pH adjusting agent) other than the abrasive grains containing silica may be further mixed. The mixing amount of these components may be adjusted so that the content of each component in the polishing liquid is in the aforementioned range.

The polishing liquid for CMP of the present embodiment can also be obtained by diluting or condensing a dispersion which has been prepared in advance by mixing the abrasive grains containing silica and the liquid medium. Furthermore, the polishing liquid for CMP of the present embodiment may be obtained by mixing a first liquid containing abrasive grains containing silica and a liquid medium and a second liquid containing an additive and a liquid medium, the first liquid and the second liquid having been prepared in advance.

<Polishing Method>

The polishing method of the present embodiment includes a step of removing a material to be polished (for example, a tungsten material or the like) by CMP using the polishing liquid of the above-described embodiment. In the polishing method of the present embodiment, for example, a base substrate (such as a substrate) including a material to be polished is polished using a polishing apparatus. As the polishing apparatus, for example, a general polishing apparatus, which includes a polishing platen on which a polishing pad (polishing cloth) is pasted and to which a motor or the like capable of changing the number of revolutions is attached and a holder (head) holding the base substrate, can be used. The polishing pad is not particularly limited, and a general nonwoven fabric, foamed polyurethane, a porous fluororesin, and the like can be used.

The polishing method of the present embodiment includes, for example, a step of preparing a base substrate including a material to be polished (preparation step), a step of disposing this base substrate on a polishing pad (disposing step), and a step of polishing this base substrate by using a polishing liquid (polishing step). Hereinafter, the polishing method of the present embodiment will be specifically described using FIG. 1 while an embodiment using, as the base substrate including a material to be polished, a base substrate including the first portion, the second portion, and the third portion mentioned above will be described as an example.

First, as illustrated in FIG. 1(a), as a base substrate before polishing, a base substrate (substrate) 100, which includes a first portion 1 having a groove formed on a surface and composed of an insulating material, a second portion 2 provided on the first portion 1, and a third portion 3 provided between the first portion 1 and the second portion 2, is prepared (preparation step). The second portion 2 is composed of a tungsten material and is deposited so as to bury a concave portion formed by the first portion and the third portion. The third portion 3 is composed of a barrier material and is formed to follow irregularities on the surface of the first portion 1.

Next, as illustrated in FIG. 1(b), the base substrate 100 is disposed on a polishing pad 10 so that a surface of the second portion 2 on a side opposite to the first portion 1 faces the polishing pad 10 (disposing step).

Next, in a state where the base substrate 100 is pressed against to the polishing pad 10, the polishing liquid for CMP of the above-described embodiment is supplied between the polishing pad 10 and the base substrate 100, and at least the second portion is polished by relatively moving the polishing pad 10 and the base substrate 100 (polishing step). At this time, the second portion 2 and the third portion 3 may be removed until the first portion 1 is exposed, or over-polishing of excessively polishing the first portion 1 may be performed. According to such over-polishing, the flatness of the polished surface after polishing can be enhanced. Through the above operation, a base substrate 200 illustrated in FIG. 1(c) is obtained.

The polishing conditions are not particularly limited, but the rotational speed of the polishing platen is preferably set to 200 rpm or less so as not to fly off the base substrate. In the case of using a base substrate including a tungsten material, the polishing pressure is preferably 3 to 100 kPa. The polishing pressure is more preferably 5 to 50 kPa from the viewpoint that the uniformity of the polishing rate in a polished surface becomes favorable and favorable flatness is obtained. The polishing liquid for CMP is preferably continuously supplied to the polishing pad with a pump or the like during polishing. The amount supplied for this is not limited, but it is preferable that the surface of the polishing pad is always covered with the polishing liquid. In order to carry out the CMP while always keeping the surface state of the polishing pad constant, it is preferable to carry out a conditioning step of a polishing cloth before polishing and/or during polishing. For example, the conditioning of the polishing pad is performed with a liquid containing at least water, while using a dresser to which diamond particles attach. Subsequently, it is preferable to carry out the polishing method of the present embodiment and further carry out a substrate washing step.

EXAMPLES

Hereinafter, the present invention will be specifically described by means of Examples, but the present invention is not limited to these Examples.

(Preparation of Abrasive Grains)

In the following Examples and Comparative Examples, as the abrasive grains containing silica, silica particles (colloidal silica) A, B, C, D, E, F, G, H, I, J, and K having D50 and D90 shown in Table 1 were used. Note that, the D50 and D90 of the silica particles shown in Table 1 were measured at 25° C. using an apparatus (product name: DC24000) manufactured by Nihon Rufuto Co., Ltd. that is a centrifugal particle size distribution analyzer. In measurement, a measurement sample, which was obtained by diluting the silica particles with pure water so that the concentration of the abrasive grains (the concentration of the silica particles) became 0.5 to 3.0% by mass, was used.

TABLE 1

| | Silica particles | | | | | | | | | | |
|---|---|---|---|---|---|---|---|---|---|---|---|
| | A | B | C | D | E | F | G | H | I | J | K |
| D50 (nm) | 61 | 64 | 73 | 100 | 72 | 98 | 55 | 56 | 61 | 113 | 156 |
| D90 (nm) | 113 | 118 | 122 | 122 | 120 | 122 | 70 | 96 | 114 | 132 | 251 |
| D90-D50 (nm) | 52 | 54 | 49 | 22 | 48 | 24 | 15 | 40 | 53 | 19 | 95 |

Example 1

Malonic acid, iron nitrate nonahydrate, and silica particles (silica particles A) were mixed in deionized water. Next, hydrogen peroxide was added to obtain a polishing liquid 1 for CMP. As shown in Table 2, the mixing amount of each component was adjusted so that the contents of malonic acid became 0.04% by mass, the contents of iron nitrate nonahydrate became 0.008% by mass, the contents of silica particles A became 1.0% by mass, and the contents of hydrogen peroxide became 3.0% by mass in the polishing liquid.

Examples 2 to 6

Polishing liquids 2 to 6 for CMP were prepared in the same manner as in Example 2, except that silica particles shown in Table 2 were used instead of the silica particles A, and the mixing amounts of the silica particles were adjusted so that the contents of the silica particles in the polishing liquid became values shown in Table 2.

Examples 7 and 8

Polishing liquids 7 and 8 for CMP were prepared in the same manner as in Example 5, except that organic acids shown in Table 3 were used as the organic acid, and the mixing amounts of the organic acids were changed to the mixing amounts shown in Table 3.

Example 9

A polishing liquid 9 for CMP was prepared in the same manner as in Example 3, except that maleic acid was used instead of malonic acid, and the mixing amount of the maleic acid was adjusted so that the content of the maleic acid in the polishing liquid became 0.10% by mass.

Example 10

A polishing liquid 7 for CMP was prepared in the same manner as in Example 3, except that the amount of the iron nitrate nonahydrate was changed to 0.04% by mass.

Examples 11 and 12

Polishing liquids 11 and 12 for CMP were prepared in the same manner as in Example 3, except that anticorrosive agents shown in Table 3 were used as the anticorrosive agent, and the mixing amounts of the anticorrosive agents were changed to the mixing amounts shown in Table 3.

Comparative Examples 1 to 6

Polishing liquids 13 to 18 for CMP were prepared in the same manner as in Example 1, except that silica particles shown in Table 4 were used instead of the silica particles A, and the mixing amounts of the silica particles were adjusted so that the contents of the silica particles in the polishing liquid became values shown in Table 4.

<Evaluation>
(Particle Size Distribution Measurement)

The D50 and D90 of the silica particles in the polishing liquids 1 to 18 for CMP were measured at 25° C. using an apparatus (product name: DC24000) manufactured by Nihon Rufuto Co., Ltd. that is a centrifugal particle size distribution analyzer. Results are shown in Tables 2 to 4.

(pH Measurement)

The pH of each of the polishing liquids 1 to 18 for CMP was measured under the following conditions. Results are shown in Tables 2 to 4.

[Measurement Conditions]
Measurement temperature: 25° C.
Measuring apparatus: product name: Model (F-51) manufactured by HORIBA, Ltd.
Measurement method: After performing 3-point calibration using a pH standard solution (pH: 4.01) of a phthalate, a pH standard solution (pH: 6.86) of a neutral phosphate, and a pH standard solution (pH: 9.18) of a borate, as pH standard solutions, an electrode of the pH meter was placed in the polishing agent, and the pH upon stabilization after an elapse of 2 minutes or longer was measured by the measuring apparatus.

(Measurement of Dissociation Rate of Organic Acid)

The dissociation rate of the organic acid in the polishing liquid was obtained based on the following formula, and the ratio of the molecular number of the dissociated organic acid with respect to one iron ion atom was calculated.

Dissociation rate (%) of organic acid=$100 \times A$ $A=(K_1/B) \times (1/(1+K_1/B+K_1 \times K_2/B^2))$ $B=10^{\wedge}(-pH)$ $K_1, K_2$=Dissociation constant of the organic acid (Polishing Rate Evaluation)

The polishing rates of a tungsten material and an insulating material were measured using the polishing liquids 1 to 18 for CMP. The measurement of the polishing rates was performed by polishing the following evaluation substrates under the following polishing conditions.

[Polishing Rate Evaluation Substrate]
Substrate having a tungsten film: 12-inch tungsten film substrate in which a tungsten film having a thickness of 700 nm was formed on a silicon substrate
Substrate having an insulating film: 12-inch TEOS film substrate in which a TEOS (tetraethoxysilane) having a thickness of 1000 nm was formed on a silicon substrate

[Polishing Conditions]
Polishing pad: IC1010 (manufactured by Nitta Haas Incorporated)
Polishing pressure: 20.7 kPa
Number of revolutions of platen: 93 rpm
Number of revolutions of head: 87 rpm Amount of polishing liquid for CMP to be supplied: 300 ml Polishing time of tungsten film: 30 seconds Polishing time of insulating film (TEOS film): 60 seconds The polishing rate of the tungsten material was obtained by converting a film thickness difference before and after CMP of the tungsten film from an electrical resistance value by using a resistance measuring instrument VR-120/08S (manufactured by Hitachi Kokusai Electric Inc.). Results are shown in Tables 2 to 4. Note that, in CMP under the same condition, the polishing rate of the tungsten material is preferably 350 nm/min or more.

As for the polishing rate of the insulating material (TEOS), a film thickness difference before and after CMP of the insulating film (TEOS film) was measured using an optical film thickness meter F50 (manufactured by Filmetrics Japan, Inc.). Results are shown in Tables 2 to 4. Note that, in CMP under the same condition, the polishing rate of the insulating material is preferably 80 nm/min or less.

Furthermore, a ratio r of the polishing rate of the tungsten material and the polishing rate of the insulating material (the polishing rate of the tungsten material/the polishing rate of the insulating material) is preferably 5.0 or more.

(Pot Life Evaluation)

As an index for a pot life, a retention rate of the polishing rate of the tungsten material after storing the polishing liquid for CMP at room temperature for 1 week was evaluated. The retention rate of the polishing rate of the tungsten material was obtained by the following formula from a polishing rate (R1) of the tungsten material measured immediately after preparing the polishing liquid for CMP (within 12 hours) and a polishing rate (R2) of the tungsten material similarly measured in the polishing liquid for CMP stored at room temperature (25° C.) for 1 week. Results are shown in Tables 2 to 4. Note that, the retention rate of the polishing rate of the tungsten material is preferably 95% or more.

Tungsten polishing rate retention rate (%)=100×R1/R2

TABLE 2

| | | Example 1 | Example 2 | Example 3 | Example 4 | Example 5 | Example 6 |
|---|---|---|---|---|---|---|---|
| Polishing liquid | Name of polishing liquid for CMP | Polishing liquid 1 | Polishing liquid 2 | Polishing liquid 3 | Polishing liquid 4 | Polishing liquid 5 | Polishing liquid 6 |
| | Silica particle type | Silica A | Silica B | Silica C | Silica D | Silica E | Silica F |
| | Silica amount (mass %) | 1.0 | 1.9 | 1.5 | 1.1 | 2.4 | 2.0 |
| | Silica particle diameter D50 (nm) | 62 | 65 | 75 | 101 | 74 | 98 |
| | D90 (nm) | 113 | 118 | 121 | 123 | 121 | 121 |
| | D90-D50 (nm) | 51 | 53 | 46 | 22 | 47 | 23 |
| | Organic acid type | Malonic acid | | | | | |
| | Organic acid amount (mass %) | 0.04 | | | | | |
| | Iron ion supplying agent | Iron nitrate nonahydrate | | | | | |
| | Iron ion supplying agent amount (mass %) | 0.008 | | | | | |
| | Molar quantity (mmol) of dissociated organic acid | 0.159 | | | | | |
| | Molar quantity (mmol) of iron ions | 0.02 | | | | | |
| | Molecular number of dissociated organic acid with respect to one iron ion molecule | 8.0 | | | | | |
| | Anticorrosive agent type | — | | | | | |
| | Anticorrosive agent amount (mass %) | — | | | | | |
| | Oxidizing agent type | Hydrogen peroxide | | | | | |
| | Oxidizing agent amount (mass %) | 3.00 | | | | | |
| | pH of polishing liquid | 2.7 | 2.7 | 2.7 | 2.7 | 2.7 | 2.7 |
| Polishing rate (nm/min) | Immediately after mixing Tungsten material | 377 | 451 | 440 | 403 | 472 | 456 |
| | Insulating material (TEOS) | 67 | 51 | 49 | 45 | 49 | 45 |
| | After 1 week Tungsten material | 360 | 440 | 430 | 400 | 470 | 445 |
| | Polishing rate ratio r | 5.6 | 8.8 | 9.0 | 9.0 | 9.7 | 10.2 |
| Pot life | Tungsten polishing rate retention rate (%) | 95 | 98 | 98 | 99 | 100 | 98 |

TABLE 3

| | | Example 7 | Example 8 | Example 9 | Example 10 | Example 11 | Example 12 |
|---|---|---|---|---|---|---|---|
| Polishing liquid | Name of polishing liquid for CMP | Polishing liquid 7 | Polishing liquid 8 | Polishing liquid 9 | Polishing liquid 10 | Polishing liquid 11 | Polishing liquid 12 |
| | Silica particle type | Silica E | Silica E | Silica C | Silica C | Silica C | Silica C |
| | Silica amount (mass %) | 2.4 | 2.4 | 1.5 | 1.5 | 1.5 | 1.5 |
| | Silica particle diameter D50 (nm) | 74 | 74 | 75 | 75 | 75 | 75 |
| | D90 (nm) | 121 | 121 | 121 | 121 | 121 | 121 |
| | D90-D50 (nm) | 47 | 47 | 46 | 46 | 46 | 46 |
| | Organic acid type | Malic acid | Citric acid | Maleic acid | | Malonic acid | |
| | Organic acid amount (mass %) | 0.40 | 0.15 | 0.10 | | 0.04 | |
| | Iron ion supplying agent | | | Iron nitrate nonahydrate | | | |
| | Iron ion supplying agent amount (mass %) | 0.008 | 0.008 | 0.008 | 0.04 | 0.008 | |
| | Molar quantity (mmol) of dissociated organic acid | 0.459 | 0.148 | 0.731 | 0.158 | 0.159 | |

TABLE 3-continued

|  |  | Example 7 | Example 8 | Example 9 | Example 10 | Example 11 | Example 12 |
|---|---|---|---|---|---|---|---|
|  | Molar quantity (mmol) of iron ions | 0.02 | 0.02 | 0.02 | 0.1 | 0.02 | |
|  | Molecular number of dissociated organic acid with respect to one iron ion molecule | 23.0 | 7.4 | 36.6 | 1.6 | 8.0 | |
|  | Anticorrosive agent type |  |  |  |  | 6-Aminohexanoic acid | 1,2,4-Triazole |
|  | Anticorrosive agent amount (mass %) | — | | | | 0.050 | 0.024 |
|  | Oxidizing agent type | Hydrogen peroxide | | | | | |
|  | Oxidizing agent amount (mass %) | 3.00 | | | | | |
|  | pH of polishing liquid | 3 | 3 | 2.7 | 2.7 | 3 | 3 |
| Polishing rate (nm/min) | Immediately after mixing — Tungsten material | 435 | 444 | 445 | 484 | 351 | 387 |
|  | Immediately after mixing — Insulating material (TEOS) | 47 | 52 | 52 | 55 | 41 | 41 |
|  | After 1 week — Tungsten material | 418 | 422 | 316 | 450 | 372 | 370 |
|  | Polishing rate ratio r | 9.3 | 8.5 | 8.6 | 8.8 | 8.6 | 9.4 |
| Pot life | Tungsten polishing rate retention rate (%) | 96 | 95 | 71 | 93 | >100 | 96 |

TABLE 4

|  |  | Comparative Example 1 | Comparative Example 2 | Comparative Example 3 | Comparative Example 4 | Comparative Example 5 | Comparative Example 6 |
|---|---|---|---|---|---|---|---|
| Polishing liquid | Name of polishing liquid for CMP | Polishing liquid 13 | Polishing liquid 14 | Polishing liquid 15 | Polishing liquid 16 | Polishing liquid 17 | Polishing liquid 18 |
|  | Silica particle type | Silica G | Silica G | Silica H | Silica I | Silica J | Silica K |
|  | Silica amount (mass %) | 2.2 | 0.8 | 2.2 | 0.6 | 0.7 | 2.0 |
|  | Silica particle diameter D50 (nm) | 55 | 55 | 57 | 61 | 112 | 157 |
|  | D90 (nm) | 70 | 70 | 95 | 114 | 132 | 250 |
|  | D90−D50 (nm) | 15 | 15 | 38 | 53 | 20 | 93 |
|  | Organic acid type | Malonic acid | | | | | |
|  | Organic acid amount (mass %) | 0.04 | | | | | |
|  | Iron ion supplying agent | Iron nitrate nonahydrate | | | | | |
|  | Iron ion supplying agent amount (mass %) | 0.008 | | | | | |
|  | Molar quantity (mmol) of dissociated organic acid | 0.158 | | | | | |
|  | Molar quantity (mmol) of iron ions | 0.02 | | | | | |
|  | Molecular number of dissociated organic acid with respect to one iron ion molecule | 8.0 | | | | | |
|  | Anticorrosive agent type | — | | | | | |
|  | Anticorrosive agent amount (mass %) | — | | | | | |
|  | Oxidizing agent type | Hydrogen peroxide | | | | | |
|  | Oxidizing agent amount (mass %) | 3.00 | | | | | |
|  | pH of polishing liquid | 2.7 | 2.7 | 2.7 | 2.7 | 2.7 | 2.7 |
| Polishing rate (nm/min) | Immediately after mixing — Tungsten material | 383 | 255 | 450 | 318 | 289 | 253 |
|  | Immediately after mixing — Insulating material (TEOS) | 118 | 51 | 96 | 56 | 42 | 54 |
|  | After 1 week — Tungsten material | 372 | 250 | 455 | 316 | 288 | 240 |
|  | Polishing rate ratio r | 3.2 | 5.0 | 4.7 | 5.7 | 6.9 | 4.7 |
| Pot life | Tungsten polishing rate retention rate (%) | 97 | 98 | 101 | 99 | 100 | 95 |

REFERENCE SIGNS LIST

1: first portion 1, 2: second portion 2, 3: third portion, 10: polishing pad, 100, 200: substrate (base substrate).

The invention claimed is:

1. A polishing liquid for CMP, comprising: abrasive grains containing silica; an anticorrosive agent containing 6-aminohexanoic acid; and a liquid medium, wherein
in a particle size distribution on mass basis obtained by a centrifugation method, D50 of the abrasive grains is 150 nm or less, D90 of the abrasive grains is 100 nm or more, and a difference between the D90 and the D50 is 21 nm or more, and
a content of the abrasive grains is 1.0% by mass or more based on the total amount of the polishing liquid.

2. The polishing liquid for CMP according to claim 1, wherein a content of the abrasive grains is 5.0% by mass or less based on the total amount of the polishing liquid.

3. The polishing liquid for CMP according to claim 1, wherein the D50 is 50 nm or more.

4. The polishing liquid for CMP according to claim 1, wherein the D90 is 200 nm or less.

5. The polishing liquid for CMP according to claim 1, further comprising an oxidizing agent.

6. The polishing liquid for CMP according to claim 5, wherein the oxidizing agent contains hydrogen peroxide.

7. The polishing liquid for CMP according to claim 1, further comprising an iron ion supplying agent.

8. The polishing liquid for CMP according to claim 7, wherein the iron ion supplying agent contains at least one selected from the group consisting of iron nitrate and iron nitrate hydrate.

9. The polishing liquid for CMP according to claim 7, further comprising an organic acid, wherein
a ratio of a molecular number of the dissociated organic acid with respect to one iron ion atom is 2.0 or more.

10. The polishing liquid for CMP according to claim 9, wherein the organic acid is a divalent or trivalent organic acid having no carbon-carbon unsaturated bond.

11. The polishing liquid for CMP according to claim 9, wherein the organic acid contains at least one selected from the group consisting of malonic acid, succinic acid, adipic acid, glutaric acid, malic acid, and citric acid.

12. The polishing liquid for CMP according to claim 1, wherein a pH is 4.0 or less.

13. The polishing liquid for CMP according to claim 1, wherein a pH is 2.0 or more.

14. A method for polishing a base substrate, the method comprising:
- a step of preparing a base substrate including a first portion composed of an insulating material and a second portion provided on the first portion and composed of a tungsten material;
- a step of disposing the base substrate on a polishing pad so that a surface of the second portion on a side opposite to the first portion faces the polishing pad; and
- a step of polishing at least the second portion by supplying the polishing liquid according to claim 1 between the polishing pad and the base substrate and relatively moving the polishing pad and the base substrate.

* * * * *